(12) United States Patent
Kato et al.

(10) Patent No.: US 6,898,108 B2
(45) Date of Patent: May 24, 2005

(54) SEMICONDUCTOR STORAGE DEVICE AND METHOD FOR DRIVING THE SAME

(75) Inventors: Yoshihisa Kato, Shiga (JP); Takayoshi Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 76 days.

(21) Appl. No.: 10/647,352

(22) Filed: Aug. 26, 2003

(65) Prior Publication Data

US 2004/0052122 A1 Mar. 18, 2004

(30) Foreign Application Priority Data

Sep. 13, 2002 (JP) .................................... 2002-268515

(51) Int. Cl.[7] .......................................... G11C 11/22
(52) U.S. Cl. ................................. 365/145; 365/203
(58) Field of Search ................................ 365/145, 149, 365/203

(56) References Cited

U.S. PATENT DOCUMENTS

| | | | |
|---|---|---|---|
| 6,151,242 A | 11/2000 | Takashima | |
| 6,198,652 B1 | 3/2001 | Kawakubo et al. | 365/145 |
| 6,819,584 B2 * | 11/2004 | Noh | 365/145 |
| 2003/0028745 A1 | 2/2003 | Hosoi | |
| 2003/0086312 A1 | 5/2003 | Kang | |
| 2003/0103373 A1 | 6/2003 | Kang | |

FOREIGN PATENT DOCUMENTS

| | | |
|---|---|---|
| EP | 1 187 140 A2 | 3/2002 |
| EP | 1 246 192 A1 | 10/2002 |
| EP | 1 349 173 A2 | 10/2003 |
| JP | 7-302497 | 11/1995 |
| JP | 10-162585 | 6/1998 |
| JP | 2000-311491 | 11/2000 |
| WO | WO 02/25667 A2 | 3/2002 |

* cited by examiner

Primary Examiner—Tan T. Nguyen
(74) Attorney, Agent, or Firm—McDermott Will & Emery LLP (57) ABSTRACT

In a memory block, for example, included in a semiconductor storage device, memory cells, reset transistors, and gain transistors are provided. The memory block further includes charge transistors for charging the gate potentials of the gain transistors, and current shutoff transistors for disconnecting electrical connection between the gain transistors and bit lines.

9 Claims, 6 Drawing Sheets

SEMICONDUCTOR STORAGE DEVICE AND METHOD FOR DRIVING THE SAME

BACKGROUND OF THE INVENTION

The present invention relates to semiconductor storage devices in which gate transistors are connected to memory cells which include capacitors using ferroelectrics. The present invention also relates to methods for driving the semiconductor storage devices.

A conventional semiconductor storage device which includes gain transistors and memory cells having ferroelectric capacitors will be described with reference to accompanying drawings.

Figure 5:
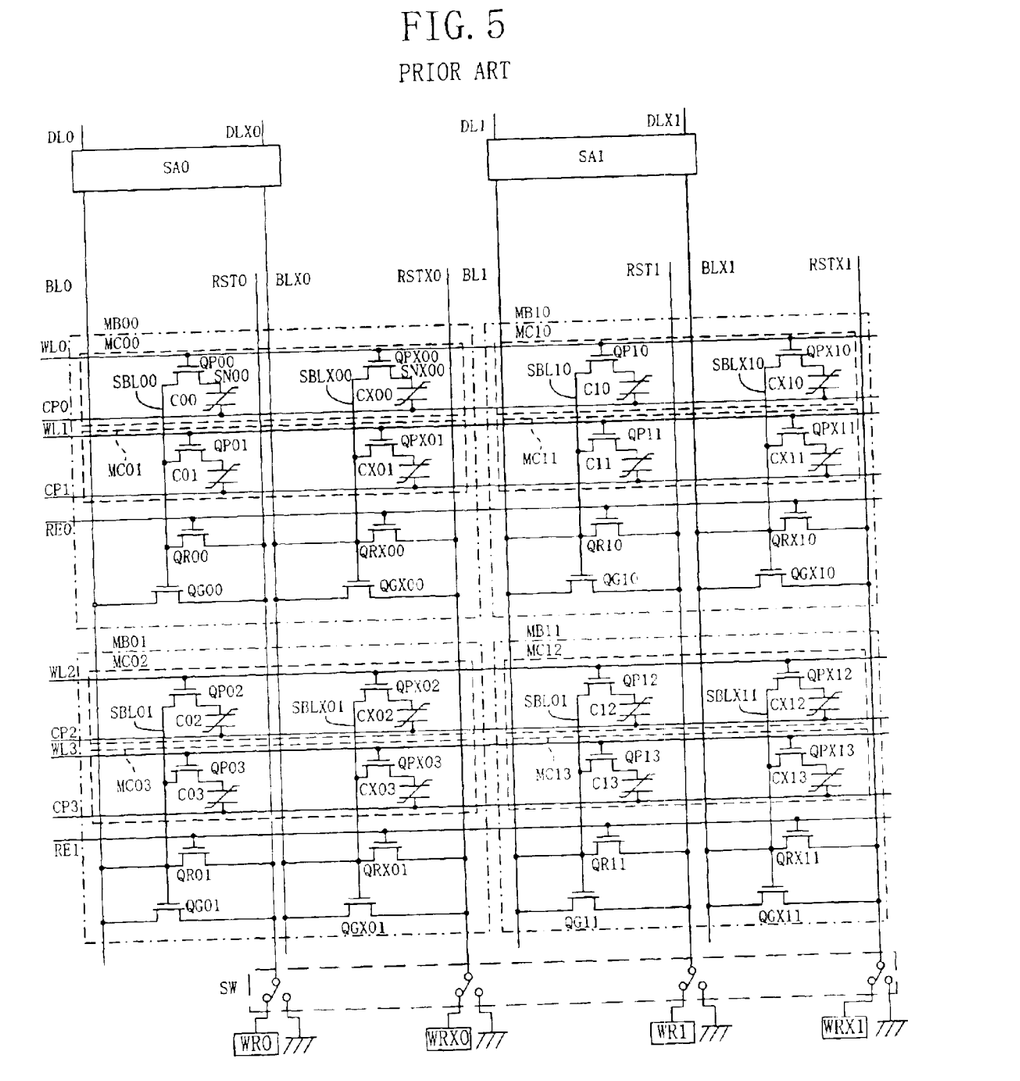
FIG. 5 is a circuit diagram illustrating the main parts of a conventional ferroelectric memory device.

FIG. 5 shows the circuit configuration of the conventional ferroelectric memory device.

As shown in FIG. 5, four memory blocks MB00 through MB11 are arranged in the form of a matrix with two rows and two columns. Provided in the memory block MB00, for example, are two memory cells MC00 and MC01, reset transistors QR00 and QRX00, and gain transistors QG00 and QGX00. The memory cell MC00 includes pass transistors QP00 and QPX00 and ferroelectric capacitors C00 and CX00.

The gates of the gain transistors QG00 and QGX00, for example, are connected to sub bit lines SBL00 and SBLX00, respectively, while the respective drains thereof are connected to bit lines BL0 and BLX0 and the respective sources thereof are connected to reset lines RST0 and RSTX0.

The gates of the reset transistors QR00 and QRX00, for example, are connected to a reset transistor control line RE0, while the respective drains thereof are connected to the sub bit lines SBL00 and SBLX00 and the respective sources thereof are connected to the reset lines RST0 and RSTX0.

The bit lines BL0 and BLX0 are connected to a sense amplifier SA0 which includes a cross coupled inverter, for example. The reset lines RST0 and RSTX0 are each connected via a respective switch SW to a ground power source or respective data write circuits WR0 and WRX0.

The memory cell MC00, for example, includes two ferroelectric capacitors C00 and CX00 and two pass transistors QP00 and QPX00. The ferroelectric capacitors C00 and CX00 on the one hand each have an electrode that is connected to a cell plate line CP0. The respective electrodes on the other hand, i.e., storage nodes SN00 and SNX00, of the ferroelectric capacitors C00 and CX00 are connected to the sub bit lines SBL00 and SBLX00 respectively through the pass transistors QP00 and QPX00. The gates of the pass transistors QP00 and QPX00 are connected to a word line WL0. In the two ferroelectric capacitors C00 and CX00 included in the memory cell MC00, data is recorded in a complementary relation in which polarization in the capacitive film in one of the capacitors C00 and CX00 is upward and in the other is downward.

Figure 6A:
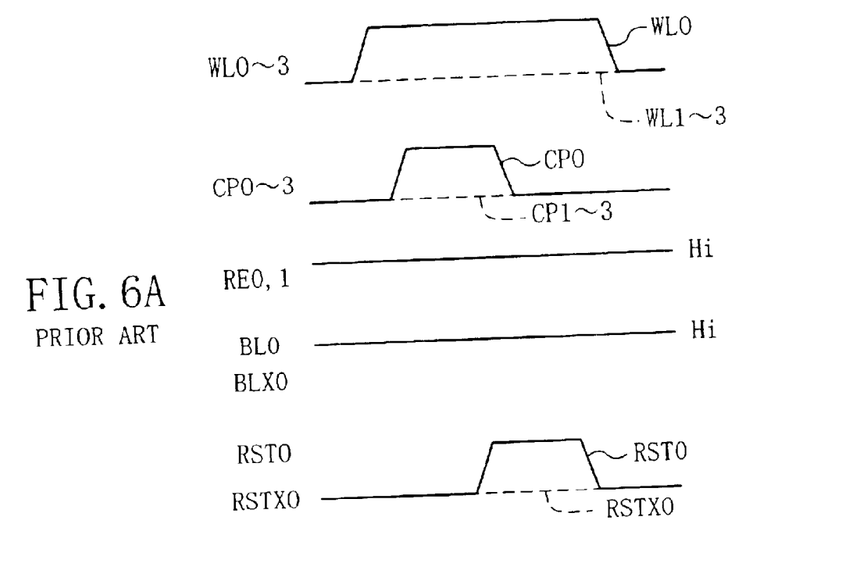

Hereinafter, write and read operations in the conventional semiconductor storage device will be described with reference to timing charts shown in FIGS. 6A and 6B.

(Write Operation)

A case in which data "0" is written into the memory cell MC00 included in the memory block MB00 will be described herein as an example.

First, the switches SW are connected to the ground power source to ground the reset lines RST0 and RSTX0. Thereafter, as shown in FIG. 6A, a high voltage is applied to the word line WL0 and the reset transistor control line RE0 to turn on the pass transistors QP00 and QPX00 and the reset transistors QR00 and QRX00. Subsequently, a positive polarity pulse voltage is applied to the cell plate line CP0, which polarizes the two ferroelectric capacitors C00 and CX00 in the direction (upward as seen in the figure) toward the respective electrodes located close to the storage nodes SN00 and SNX00.

Next, the switches SW are switched to connect the reset line RST0, e.g., with the data write circuit WR0, e.g., so that a positive polarity pulse voltage is applied to the reset line RST0 from the data write circuit WR0. The applied pulse voltage changes the polarization direction in the ferroelectric capacitors C00 to the direction (downward as seen in the figure) toward the electrode thereof located close to the cell plate line CP0. At this time, the other data write circuits WRX0 and WR1, for example, output the ground potential.

It should be noted that when a voltage greater than or equal to the coercive voltage of the ferroelectric is applied across the two electrodes, polarization in the ferroelectric capacitor C00, for example, is directed in the direction of the polarity of the voltage between the electrodes, that is, the direction going from the positive voltage electrode toward the negative voltage electrode.

The write operation as described above makes the polarization directions in the two ferroelectric capacitors C00 and CX00 in the memory cell MC00 different from each other to determine data. The semiconductor storage device including the ferroelectric capacitor C00, for example, keeps its polarization state even if the device is turned off, and thus acts as a non-volatile memory.

(Read Operation)

Referring to the timing chart shown in FIG. 6B, an operation for reading out the data "0" that has been written in the memory cell MC00 in the above-described manner will be described.

In the data read operation, the switches SW are switched for connecting the reset lines RST0 and RSTX0 to the ground power source so that the reset line RST0, for example, is grounded. Further, a pre-charge circuit (not shown) is turned on to pre-charge the bit lines BL0 and BLX0 to a high potential.

Figure 6B:
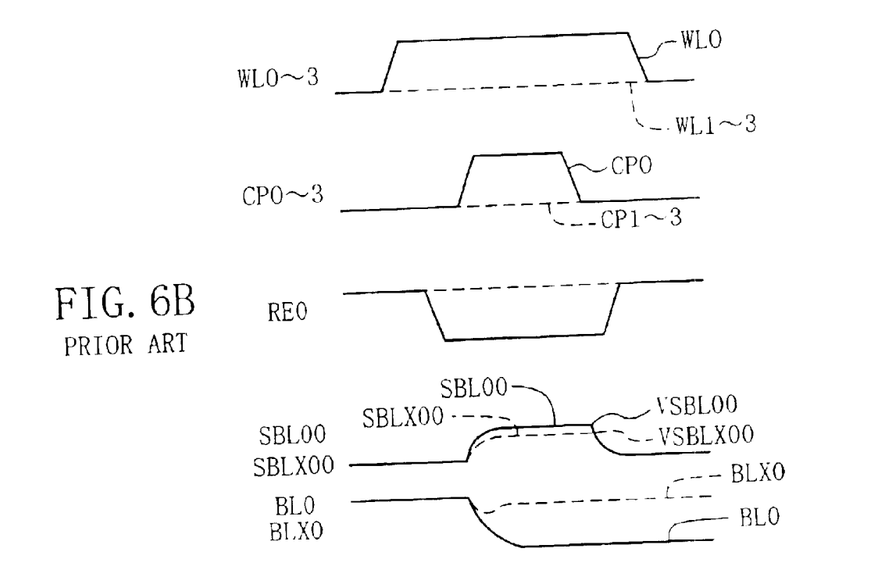
FIG. 6B is a timing chart indicating read operation.

Subsequently, as shown in FIG. 6B, a high voltage is applied to the word line WL0 and the reset transistor control line RE0 to turn on the pass transistors QP00 and QPX00 and the reset transistors QR00 and QRX00, so that the storage nodes SN00 and SNX00 of the ferroelectric capacitors C00 and CX00 are reset to a reset potential, that is, the ground potential.

After the storage-node SN00 and SNX00 potentials are reset to the ground potential, the potential of the reset transistor control line RE0 is set low to turn off the reset transistors QR00 and QRX00, and at the same time the pre-charge circuit is turned off. Thereafter, the sense amplifier SA0 is activated, while a positive polarity pulse is applied to the cell plate line CP0. This permits the electric charge to be transferred from the ferroelectric capacitors C00 and CX00 to the gates of the gain transistors QG00 and QGX00, respectively, which causes the respective potentials of the sub bit lines SBL00 and SBLX00 to increase to turn on the gain transistors QG00 and QGX00. As a result, the potentials of the bit lines BL0 and BLX0 drop from their pre-charge level. At this time, since electric charge produced in the downwardly polarized ferroelectric capacitor C00 is greater than electric charge created in the upwardly polarized ferroelectric capacitor CX00, the potential (VSBL00) of the sub bit line SBL00 exceeds the potential (VSBLX00) of the sub bit line SBLX00. As a consequence, the gain transistor QG00 has a channel resistance smaller than that of the gain transistor QGX00, which causes the potential of the bit line BL0 to vary more greatly than the potential of the bit line BLX0. Such difference in the potential variation produces a potential difference between the pair of bit lines BL0 and BLX0, and the resultant potential difference is then multiplied by the sense amplifier SA0.

In the sense amplifier SA0, the stored data is determined as "0" because, of the bit line BL0 and BLX0 pair, the bit line BL0 is of a low potential while the bit line BLX0 is of a high potential. The determination result is then outputted from data output lines DL0 and DLX0 to external devices.

Then, the potential of the reset transistor control line RE0 is set high to turn on the reset transistors such that the storage nodes SN00 and SNX00 are reset to the RST potential, i.e., the ground potential, while the word line WL0 is set to a low potential to turn off the pass transistors QP00 and QPX00, thereby completing the read operation.

The conventional semiconductor storage device, however, has a problem in that a voltage difference (i.e., offset voltage) is produced between the read voltages in the two gain transistors QG00 and QGX00 included in the memory cell MC00, for example, and the offset voltage causes the read margin to decrease.

In the data read operation, the potential difference generated between the complementary sub-bit-line SBL00 and SBLX00 pair, for example, is converted into the channel-resistance difference, and the difference in the drain-source current resulting from the channel-resistance difference is detected by the sense amplifier SA0 as the potential variation created in the bit line BL0 and BLX0 pair.

Since the gain transistors QG00 and QGX00 operate in saturation regions, the drain-source current thereof is proportional to the square of the difference between the gate voltage and the threshold voltage according to a simplified equation for the drain-source current. Given that the respective drain-source currents of the gain transistors QG00 and QGX00 are IDS00 and IDSX00 and that the respective threshold voltage values thereof are VT00 and VTX00, the following equation 1 holds.

$$IDS00/IDSX00 = (VSBL00 - VT00)^2 / (VSBLX00 - VTX00)^2 \quad \text{Equation 1}$$

If it is assumed that the voltages produced in the read operation and the threshold voltages are: VSBL00=1.0 V, VSBLX00=0.9 V, and VT00=VTX00=0.6 V, for example, then IDS00/IDSX00=1.78. Nevertheless, if it is assumed that there is an offset voltage of 0.1 V between the pair of gain transistors QG00 and QGX00, that is, if VT00=0.7 V and VTX00=0.6 V, for example, then IDS00/IDSX00=1. This means that the sense amplifier cannot perform sensing operation.

Such decrease in the drain-source current ratio due to the presence of the offset voltage causes decrease in immunity to noise which enters the sub bit lines when a driving pulse is applied to other wires.

Further, read charge might decrease because of reduced remnant polarization (retention) stored in the ferroelectric capacitors or due to variation (imprint) in the ferroelectric hysteresis caused by elevated-temperature environment. Or a difference in the two ferroelectric capacitors' electric charge caused due to variation created during the manufacturing process, for example, might result in decrease in the potential difference VSBL00—VSBLX00 between the sub bit lines, thereby leading to reduction in the operation margin.

The known methods which have been proposed to deal with the above problems include a method for canceling offset voltage in a sense amplifier by accumulating the offset voltage in a capacitor (disclosed in Japanese Laid-Open Publication No. 07-302497), a method for reducing offset voltage by providing the sense amplifier with trimming function (disclosed in Japanese Laid-Open Publication No. 10-162585), and a method for compensating for offset voltage by adjusting the well potential of MOS transistors forming the sense amplifier (disclosed in Japanese Laid-Open Publication No. 2000-311491).

However, the methods disclosed in those publications are to cancel offset voltage created in a sense amplifier and not to cancel offset voltage produced in a gain transistor which is connected to a memory cell.

SUMMARY OF THE INVENTION

It is therefore an object of the present invention to solve the above problems to compensate for offset voltage in a gain transistor in a semiconductor storage device which includes the gain transistor and a memory cell that has a capacitor made of a ferroelectric.

To achieve the object, in a semiconductor storage device of the present invention, the threshold voltage of a gain transistor or a voltage value obtained by adding an offset to the threshold voltage is applied to the gate of the gain transistor, which gate is subjected to application of the potential of a sub bit line connected via a pass transistor to the storage node of a capacitor.

Another inventive semiconductor storage device employs a structure which enables drain-source current to be shut off in a gain transistor, the gate of which is subjected to application of the potential of a sub bit line connected via a pass transistor to the storage node of a capacitor.

Specifically, a first inventive semiconductor storage device includes: a memory cell including a capacitor and a pass transistor, wherein the capacitor includes a capacitive film made of a ferroelectric and the pass transistor is connected to a storage node of the capacitor; a sub bit line connected to the pass transistor; a gain transistor whose gate, drain and source are connected to the sub bit line, a bit line, and a source line, respectively; and a charging device for charging the voltage of the sub bit line up to the threshold voltage of the gain transistor or a voltage value obtained by adding an offset to the threshold voltage.

In the first inventive semiconductor storage device, the threshold voltage of the gain transistor is fed back to the gate potential so that offset voltage due to variation in the threshold voltage is compensated for, thereby enabling read operation to be performed stably.

The first inventive semiconductor storage device preferably further includes a reset-voltage applying device for applying a predetermined reset voltage to the sub bit line. Then, after the sub bit line and the storage node of the capacitor have been charged to the threshold voltage of the gain transistor, it is possible to set the sub bit line alone to the reset potential. For example, in the case where the gain transistor is of n-channel type, the reset voltage set lower than the threshold voltage of the gain transistor permits the gate potential of the gain transistor to be lowered during read operations, which allows the output amplitude of, that is, the gain of the gain transistor to increase.

A first inventive method for driving a semiconductor storage device is applicable to a semiconductor storage device which includes: a memory cell which includes a capacitor having a capacitive film made of a ferroelectric, and a pass transistor connected to one electrode of the capacitor; a sub bit line connected to the pass transistor; a gain transistor whose gate, drain and source are connected to the sub bit line, a bit line and a source line, respectively; and a charging device for charging the voltage of the sub bit line up to the threshold voltage of the gain transistor or a voltage value obtained by adding an offset to the threshold voltage. The first inventive method includes the steps of: (a) charging, by the charging device, the sub bit line and said one electrode of the capacitor up to the threshold voltage or the voltage value obtained by adding the offset to the threshold voltage, and (b) applying a read voltage to the other electrode of the capacitor for detection of variation in channel resistance in the gain transistor, thereby reading out data retained in the capacitor.

According to the first inventive method, in the sub bit line is generated a voltage which is obtained by adding the threshold voltage VT to potential variation VSBL caused by the application of the read voltage, and drain-source current IDS in the gain transistor is expressed by the equation:

$$IDS \propto (VSBL+VT-VT)^2 = VSBL^2,$$

and therefore is not affected by the threshold voltage variation.

In the first inventive method, the semiconductor storage device preferably includes a reset-voltage applying device for applying a predetermined reset voltage to the sub bit line, and the step (a) preferably further includes the step of turning on the reset-voltage applying device so that the reset voltage is applied to the sub bit line, and thereafter turning off the reset-voltage applying device.

Then, after the sub bit line and the storage node of the capacitor have been charged to the threshold voltage of the gain transistor or the voltage value obtained by adding the offset to the threshold voltage, it is possible to reset the sub bit line alone to the reset voltage. In addition, the amount of electric charge Qp depending on the threshold voltage is left in the storage node.

Given that Cf represents the capacitance value of the capacitor and Vp indicates the voltage of the electrode (cell plate) located opposite to the storage node of the capacitor, the amount of electric charge in the capacitor is expressed by the equation $Qp=Cf \cdot (Vp-VT)$. Upon application of the read voltage to the cell plate of the capacitor, the amount of electric charge Qp is divided into the capacitance (of a value CSBL) of the sub bit line and the capacitance of the capacitor. The division of the electric charge allows effects exerted on the drain-source current by the threshold voltage VT variation during the read operation to be reduced by the capacitance ratio CSBL/(CSBL+Cf). In addition, in the case where the gain transistor is of n-channel type, the reset voltage set lower than the threshold voltage of the gain transistor permits the gate potential of the gain transistor to be reduced during the read operation, which allows the output amplitude of, that is, the gain of the gain transistor to increase.

In the first inventive method, the step (a) preferably further includes the step of applying, to the other electrode of the capacitor, a voltage which is an intermediate voltage between the read voltage and the threshold voltage or between the read voltage and the voltage value that is obtained by adding the offset to the threshold voltage, and the voltage applied across both the electrodes of the capacitor preferably does not exceed the coercive voltage of the capacitive film. Then, it is possible to prevent destruction of the state of polarization that has been stored before the data readout operation is carried out.

In the first inventive method, the memory cell preferably includes a pair of capacitors each including a capacitive film made of a ferroelectric, and the method preferably further includes, after the step (b), the step (c) of applying, to one of the capacitors in which the amount of polarization is varied by the read operation, a voltage for rewriting which is smaller than normal write voltage which causes said amount of polarization to be saturated. This makes it possible to reduce stress applied to the ferroelectric capacitive film, while allowing the polarization state that has changed due to the data read operation to revert to its state before the read operation.

A second inventive semiconductor storage device includes: a memory cell including a capacitor and a pass transistor, wherein the capacitor includes a capacitive film made of a ferroelectric and the pass transistor is connected to a storage node of the capacitor; a sub bit line connected to the pass transistor; a gain transistor whose gate, drain and source are connected to the sub bit line, a bit line, and a source line, respectively; and a current shutoff device for shutting off drain-source current in the gain transistor.

In the second inventive device, during the time that the gate potential of the gain transistor, that is, the potential of the sub bit line varies, the drain-source current can be shut off, thereby permitting the drain-source current to flow after the gate potential has stabilized. As a result, even if there is an offset in the gain transistor, read operation can be performed stably.

A second inventive method for driving a semiconductor storage device is applicable to a semiconductor storage device which includes: a memory cell which includes a capacitor having a capacitive film made of a ferroelectric, and a pass transistor connected to one electrode of the capacitor; a sub bit line connected to the pass transistor; a gain transistor whose gate, drain and source are connected to the sub bit line, a bit line and a source line, respectively; and a current shutoff device for shutting off drain-source current in the gain transistor. The second inventive method includes the step (a) of applying a read voltage to the other electrode of the capacitor, and shutting off the drain-source current by the current shutoff device while the potential of the sub bit line varies.

According to the second inventive method, the drain-source current in the gain transistor can be shut off during the time that the gate potential of the gain transistor, that is, the potential of the sub bit line varies, and after the gate potential has stabilized, the drain-source current is allowed to flow for data readout. As a result, even if an offset voltage is produced in the gain transistor to cause the operation margin to decrease, or even in the case where noise, decrease in retention characteristics or imprint is caused, read operation can be performed stably.

In the second inventive method, the memory cell preferably includes a pair of capacitors each including a capacitive film made of a ferroelectric, and the method preferably further includes, after the step (a), the step (b) of applying, to one of the capacitors in which the amount of polarization is varied by the read operation, a voltage for rewriting which is smaller than normal write voltage which causes said amount of polarization to be saturated.

BRIEF DESCRIPTION OF THE DRAWINGS

FIGS. 6A and 6B indicate operation timings of the conventional ferroelectric memory device. FIG. 6A is a timing chart indicating write operation, while

DESCRIPTION OF THE PREFERRED EMBODIMENTS (First Embodiment)

A first embodiment of the present invention will be described with reference to the accompanying drawings.

Figure 1:
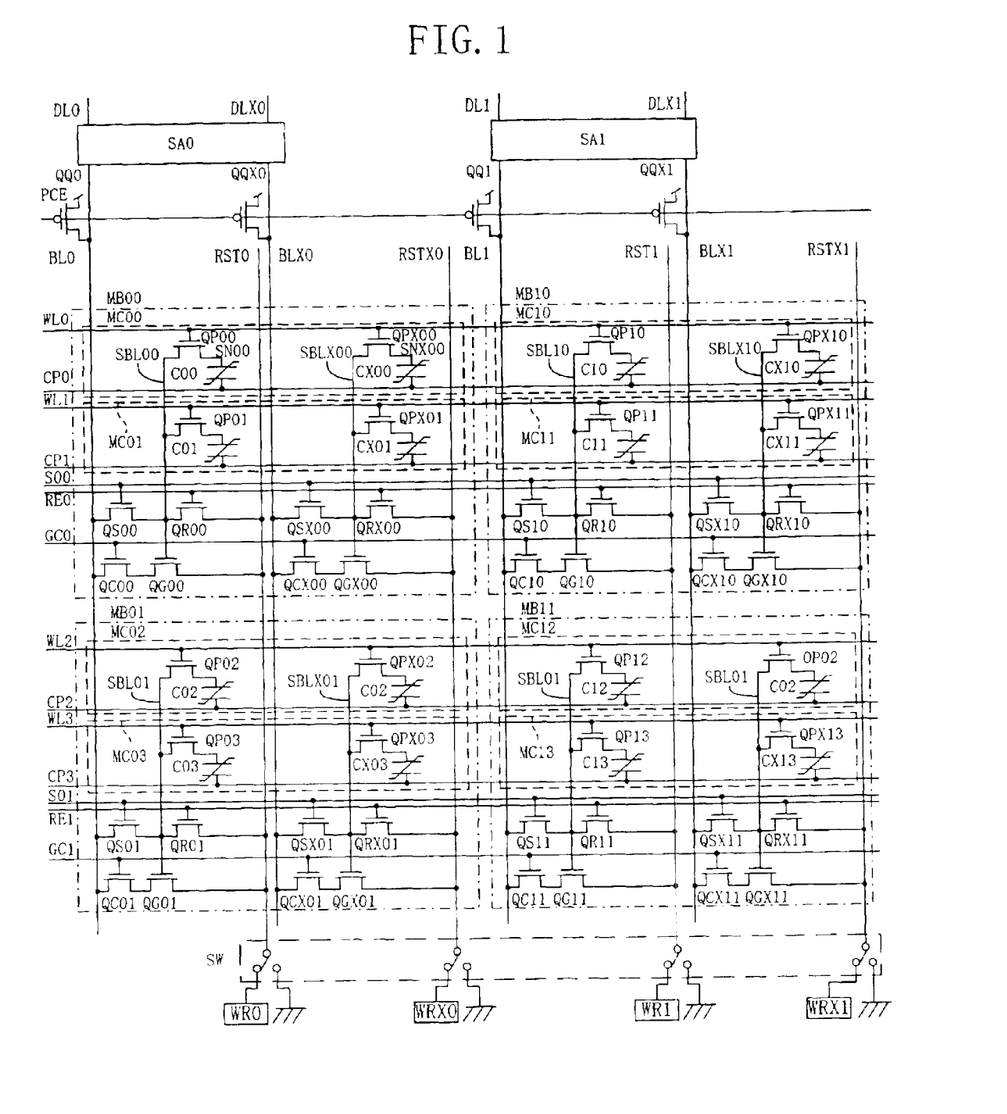
FIG. 1 is a circuit diagram illustrating the main parts of a semiconductor storage device which includes ferroelectric memories in accordance with a first embodiment of the present invention.

FIG. 1 shows the circuit configuration of a semiconductor storage device which includes ferroelectric memories in accordance with the first embodiment of the present invention.

As shown in FIG. 1, the semiconductor storage device of the first embodiment includes memory blocks MB00, MB01, MB10 and MB11, sense amplifiers SA0 and SA1, and data write circuits WR0, WRX0, WR1 and WRX1. The memory blocks MB00, MB01, MB10 and MB11 are arranged in the form of a matrix with two rows and two columns. The sense amplifier SA0 includes cross-coupled p-channel transistors, for example, and is connected to respective ends of a pair of bit lines BL0 and BLX0 that are connected to the memory blocks MB00 and MB01. The sense amplifier SA1, which has a structure equivalent to that of the sense amplifier SA0, is connected to respective ends of a pair of bit lines BL1 and BLX1 that are connected to the memory blocks MB10 and MB11. The data write circuits WR0 and WRX0 are connected via a respective switch SW to respective ends of reset lines RST0 and RSTX0 that are connected to the memory blocks MB00 and MB01. The data write circuits WR1 and WRX1 are connected via a respective switch SW to respective ends of reset lines RST1 and RSTX1 that are connected to the memory blocks MB10 and MB11. Each switch SW is capable of switching between its associated data write circuit WR0, for example, and a ground power source.

The semiconductor storage device further includes pre-charge transistors QQ0, QQX0, QQ1 and QQX1 which pre-charge the bit lines BL0, BLX0, BL1 and BLX1, respectively. The gates of the pre-charge transistors QQ0 through QQX1 are connected to a pre-charge starting line PCE, while their sources are connected to a power terminal, and their drains are connected to the bit lines BL0, BLX0, BL1 and BLX1, respectively.

Each memory block, e.g., the memory block MB00 includes two memory cells MC00 and MC01, reset transistors QR00 and QRX00, and gain transistors QG00 and QGX00. The memory block MB00 further includes charge transistors QS00 and QSX00 which charge the respective gates of the gain transistors QG00 and QGX00, and current shutoff transistors QC00 and QCX00 which shut off electrical connection established between the gain transistor QG00 and the bit line BL0 and between the gain transistor QGX00 and the bit line BLX0, respectively.

The memory cell MC00, for example, included in the memory block MB00 includes two pass transistors QP00 and QPX00 and two capacitors C00 and CX00 each having a capacitive film made of a ferroelectric. The capacitors C00 and CX00 on the one hand each have an electrode that is connected to a cell plate line CP0. The respective electrodes on the other hand, i.e., storage nodes SN00 and SNX00, of the capacitors C00 and CX00 are connected to the sub bit lines SBL00 and SBLX00 respectively through the pass transistors QP00 and QPX00. The gates of the pass transistors QP00 and QPX00 are connected to a word line WL0. In the two ferroelectric capacitors C00 and CX00 included in the memory cell MC00, data is recorded in a complementary relation in which polarization in the capacitive film in one of the capacitors C00 and CX00 is upward and in the other is downward. It should be noted that devices or wires identified by reference characters including the character "X" are complementary to their respective pairs designated by corresponding reference characters without "X" as used in the capacitor C00 and CX00 pair.

Hereinafter, it will be described how the transistors are arranged in each memory block, for example, in the memory block MB00. The respective gates of the gain transistors QG00 and QGX00 are connected to the sub bit lines SBL00 and SBLX00, while their respective drains are connected to the bit lines BL0 and BLX0 via the current shutoff transistors QC00 and QCX00, and their respective sources are connected to the reset lines RST0 and RSTX0 serving as source lines.

The respective gates of the reset transistors QR00 and QRX00 are connected to a reset transistor control line RE0, while the respective drains thereof are connected to the sub bit lines SBL00 and SBLX00, and the respective sources thereof are connected to the reset lines RST0 and RSTX0.

The respective gates of the charge transistors QS00 and QSX00 are connected to a charge transistor control line S00, while the respective drains thereof are connected to the bit lines BL0 and BLX0, and their respective sources are connected to the sub bit lines SBL00 and SBLX00.

The respective gates of the current shutoff transistors QC00 and QCX00 are connected to a current shutoff transistor control line GC0, while their respective drains are connected to the bit lines BL0 and BLX0, and their respective sources are connected to the respective drains of the gain transistors QG00 and QGX00.

As can be clearly seen from FIG. 1, the pre-charge transistors QQ0 through QQX1 are p-channel transistors and the other transistors are n-channel transistors.

(Write Operation)

Referring to a timing chart shown in FIG. 2, it will be described how a write operation is performed in a semiconductor storage device having the above-described structure. In this embodiment, an operation for writing data "0" into the memory cell MC00 in the memory block MB00 will be described as an example.

First, the switches SW are connected to the ground power source to ground the reset lines RST0 and RSTX0 so that a ground potential is supplied to the respective sources of the reset transistors QR00 and QRX00.

Figure 2:
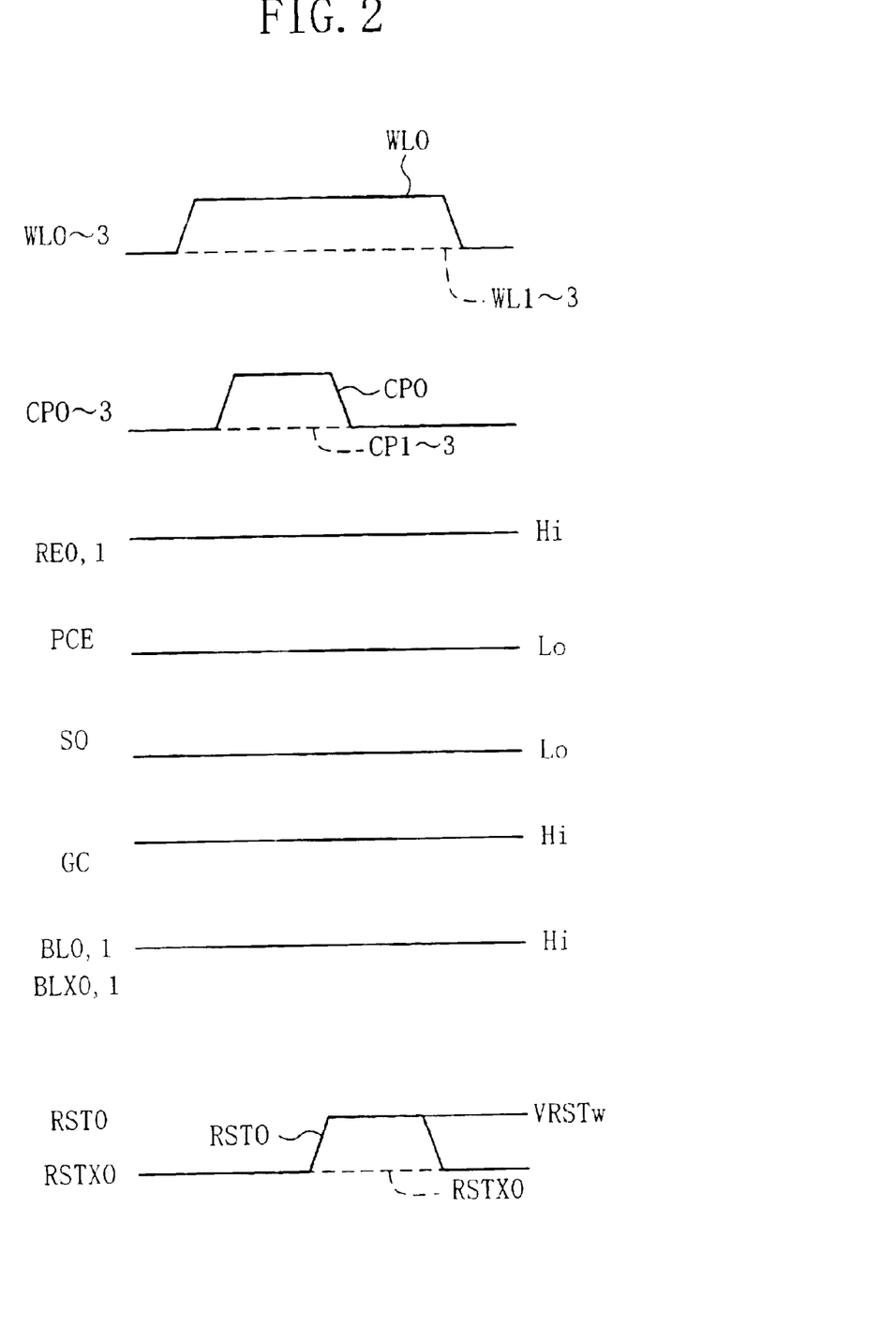
FIG. 2 is a timing chart indicating write operation in the semiconductor storage device in accordance with the first embodiment of the present invention.

Then, as shown in FIG. 2, a high voltage is applied to the word line WL0 and the reset transistor control line RE0 to turn on the pass transistors QP00 and QPX00 and the reset transistors QR00 and QRX00. This allows electrical connection to be established between the storage node SN00 of the capacitor C00 and the reset line RST0 via the sub bit line SBL00, and between the storage node SNX00 of the capacitor CX00 and the reset line RSTX0 via the sub bit line SBLX00, such that the potentials of the storage nodes SN00 and SNX00 are reset to the ground potential.

Subsequently, a positive polarity pulse voltage is applied to the cell plate line CP0, which polarizes the two ferroelectric capacitors C00 and CX00 in the direction (upward as seen in the figure) going toward the respective electrodes located close to the storage nodes SN00 and SNX00.

Next, the position of the switch SW is changed to connect the reset line RST0 to the data write circuit WR0 so that a positive polarity pulse voltage for writing, the voltage value of which is VRSTw, is applied to the reset line RST0 from the data write circuit WR0. The pulse voltage applied changes the polarization direction in the capacitor C00 to the direction (downward as seen in the figure) going toward the electrode thereof located close to the cell plate line CP0. At this time, the other data write circuits WRX0 and WR1, for example, output the ground potential.

By the above-described write operation, the data is written into the two capacitors C00 and CX00 in the memory cell MC00 as the mutually opposite polarization directions. In this embodiment, as in the conventional example, data in each memory cell represents "0" when the capacitors C * * and CX * * (the marks "* *" indicate numerical adscripts representing the respective addresses of the capacitors) included in the memory cell have downward polarization (going toward the cell plate line) and upward polarization (going toward the storage node), respectively. On the other hand, when the polarization in the capacitor C * * is upward, while the polarization in the capacitor CX * * is downward, the data in the memory cell represents "1".

The values of the positive polarity pulse voltages applied to the cell plate line CP0 and the reset line RST0, for example, during the data writing are preferably set larger than or equal to the value of a voltage at which the amount of polarization in the ferroelectric forming the respective capacitive film in the capacitors C00 and CX00 reaches a saturation level. Then, even if the capacitors C00 and CX00, for example, are turned off, the polarization state in their capacitive film is maintained, which enables the device to function as a non-volatile memory device.

(Read Operation)

Next, referring to a timing chart shown in FIG. 3, an operation for reading out the data "0" that has been written into the memory cell MC00 in the above manner will be described.

To perform the data read operation, the switches SW are first switched to connect the reset lines RST0 and RSTX0 to the ground power source so that the ground potential is supplied to the reset line RST0, for example. At this time, a low voltage is supplied to the pre-charge starting line PCE to turn on the pre-charge transistors QQ0 through QQX1, thereby pre-charging the bit lines BL0 and BLX0 both to a high potential.

Figure 3:
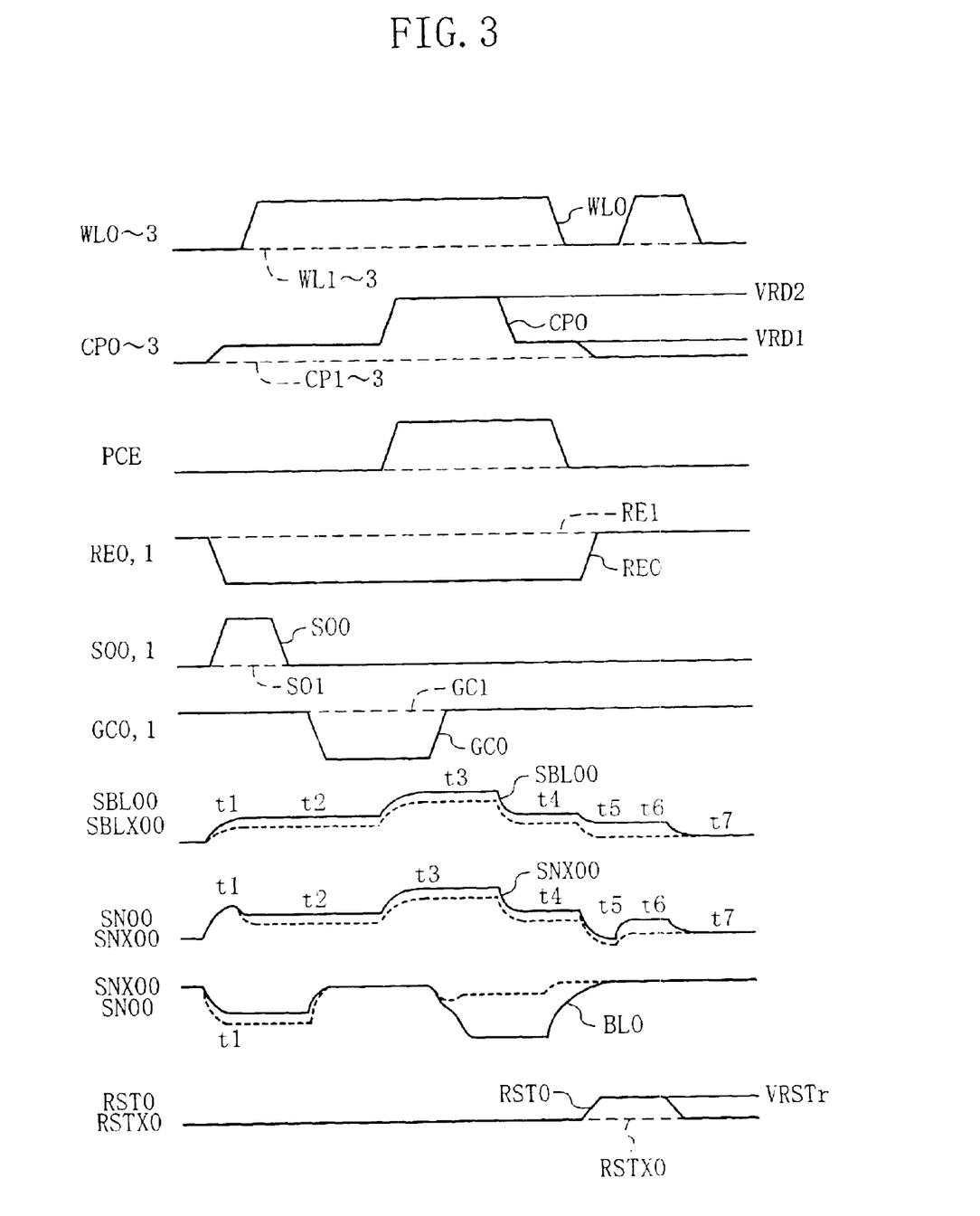
FIG. 3 is a timing chart indicating read operation in the semiconductor storage device in accordance with the first embodiment of the present invention.

At this point in time, as shown in FIG. 3, the potentials of the word lines WL0 through WL3, cell plate lines CP0 through CP03, charge transistor control lines S00 and S01 are all set low.

On the other hand, the potentials of the reset transistor control lines RE0 and RE1 and current shutoff transistor control lines GC0 and GC1 are all set high, which turns on the reset transistors QR00 and QRX01. As a result, the sub bit lines SBL00 and SBLX00 are set at the ground potential. The current shutoff transistors QC00 and QCX00 are also in the "on" state, thereby allowing electrical connection to be established between the drain of the gain transistor QG00 and the bit line BL0 and between the drain of the gain transistor QGX00 and the bit line BLX0.

Next, the reset transistor control line RE0 is set to a low potential to turn off the reset transistors QR00 and QRX00, while at the same time the charge transistor control line S00 is set to a high potential to turn on the charge transistors QS00 and QSX00. This results in the formation of closed circuits in which the respective drains of the gain transistors QG00 and QGX00 are connected to their respective gates via the current shutoff transistors QC00 and QCX00 and the charge transistors QS00 and QSX00, respectively, with the respective pre-charge transistors QQ0 and QQX0 functioning as load. As a consequence, the respective potentials of the gain-transistor QG00 and QGX00 gates, that is, the respective potentials of the sub bit lines SBL00 and SBLX00 are at threshold voltage levels VT00 and VTX00 (as seen at a timing t1 in FIG. 3) of the gain transistors QG00 and QGX00. In this embodiment, the sizes of the pre-charge transistors QQ0 and QQX0 and gain transistors QG00 and QGX00 may be adjusted so that the values VT00 and VTX00 become voltage values obtained by adding a respective predetermined amount of offset to the threshold voltage of the gain transistors QG00 and QGX00.

At substantially the same time that the potential of the reset transistor control line RE0 is set low, the potential of the cell plate line CP0 is increased to a first voltage value VRD1 so that the potentials of the storage nodes SN00 and SNX00 of the capacitors C00 and CX00 are set to the first voltage value VRD1. The first voltage value VRD1 is preferably equal to the uppermost value in the range of variation in the gain-transistor QG00 and QGX00 threshold voltage caused during the manufacturing process. Alternatively, it is preferable that the first voltage value VRD1 be set slightly higher than the uppermost value, and that the difference between the first voltage value VRD1 and the threshold voltage be smaller than the coercive voltage of the capacitive film made of a ferroelectric. More specifically, the first voltage value VRD1 is set at a value which is higher than the uppermost value of the threshold voltages by just 0.1 V, for example. In the case where the first voltage value VRD1 is set in this manner, when the pass transistors QP00 and QPX00 are turned on at the next stage (that is, at the timing t2 shown in FIG. 3), a voltage which has the same polarity as that of a voltage which will be applied in the read operation and which is smaller than or equal to the coercive voltage of the capacitive film is applied to the respective capacitors C00 and CX00. Accordingly, it is possible to avoid a situation in which a voltage higher than the coercive voltage is applied to the capacitive films before the data is read out to cause the polarity to be reversed, thereby destructing the stored data.

Subsequently, a high voltage is applied to the word line WL0 to turn on the pass transistors QP00 and QPX00 so that the potentials of the storage nodes SN00 and SNX00 of the capacitors C00 and CX00 are raised to the threshold voltages VT00 and VTX00, respectively (at the timing t2).

Thereafter, the charge transistor control line S00 and the current shutoff transistor control line GC0 are sequentially set to a low potential to turn off the charge transistors QS00 and QSX00 and the current shutoff transistors QC00 and QCX00. This causes the impedance to be high between the respective bit lines BL0 and BLX0 and their corresponding sub bit lines SBL00 and SBLX00 and between the respective bit lines BL0 and BLX0 and their corresponding gain-transistor QG00 and QGX00 drains. As a result, the potentials of the bit lines BL0 and BLX0 are pre-charged again to a high voltage.

Then, the pre-charge staring line PCE is set to a high potential, i.e., deactivated to cause the pre-charge transistors QQ0 and QQX0 to change into the "off" state, while the sense amplifier SA0 is activated. At the same time, a positive polarity pulse voltage for reading which is of a second voltage value VRD2 is applied to the cell plate line CP0. The applied pulse voltage causes the charge to transfer from the capacitors C00 and CX00 to the gain transistors QG00 and QGX00, thereby increasing the respective potentials of the sub bit lines SBL00 and SBLX00 (at the timing t3 in FIG. 3).

Subsequently, after the changes caused in the sub-bit-line SBL00 and SBLX00 potentials have stabilized, a high voltage is applied again to the current shutoff transistor control line GC0 to make conductive (i.e., to turn on) the current shutoff transistors QC00 and QCX00. As a result, the charge flows out of the bit lines BL0 and BLX0 to the reset lines RST0 and RSTX0, respectively, through the current shutoff transistors QC00 and QCX00 in the "on" state and the gain transistors QG00 and QGX00 in the "on" state; therefore the potentials of the bit lines BL0 and BLX0 drop from the pre-charge level.

As shown in FIG. 6B, the known ferroelectric memory device adopts a driving method in which immediately after the potentials of the sub bit lines SBL00 and SBLX00 change to exceed the threshold voltage established for the gain transistors QG00 and QGX00, the potentials of the bit lines BL0 and BLX0 decrease.

In the first embodiment, however, the current shutoff transistors QC00 and QCX00 electrically disconnect the bit lines BL0 and BLX0 from the gain transistors QG00 and QGX00, respectively, during the time that the potentials of the sub bit lines SBL00 and SBLX00 vary due to the application of the positive polarity pulse voltage to the cell plate line CP0 with the pre-charging of the bit lines BL0 and BLX0 being stopped. And after the sub-bit-line SBL00 and SBLX00 potentials have stabilized, the potentials of the bit line BL0 and BLX0 pair are caused to change. In this manner, the presence of the current shutoff transistors QC00 and QCX00 between the bit line BL0 and gain transistor QG00 and between the bit line BLX0 and gain transistor QGX00, respectively, permits the read operation to be performed stably.

The positive polarity pulse voltage applied to the cell plate line CP0 generates more charge in the downwardly polarized capacitor C00 than in the upwardly polarized capacitor CX00. As a result, potential variation VSBL00 in the sub bit line SBL00 created from the timing t2 to the timing t3 is larger than potential variation VSBLX00 in the complementary sub bit line SBLX00. Accordingly, the respective potentials generated in the two sub bit lines SBL00 and SBLX00 at the timing t3 are VSBL00+VT00 and VSBL00+VT01.

The ratio between the drain-source currents IDS00 and IDSX00 in the two gain transistors QG00 and QGX00 is therefore expressed by the following equation 2.

$$IDS00/IDSX00 = (VSBL00 + VT00 - VT00)^2 / (VSBLX00 + VTX00 - VTX00)^2$$
$$= VSBL00^2 / VSBLX00^2$$

Equation 2

As can be seen from the equation 2, even if a difference (i.e., a so-called offset voltage) is generated between the read voltages in the two gain transistors QG00 and QGX00, such offset voltage has no effect on the ratio.

In this embodiment, VSBL00 that is applied to the gate of the gain transistor QG00 is larger than VSBLX00 that is applied to the gate of the gain transistor QGX00. Suppose that the voltages produced in the read operation are: VSBL00 is 1.0 V and VSBLX00 is 0.9 V. In this case, IDS00/IDSX00=1.23 and the gain transistor QG00 therefore has a channel resistance smaller than that of the gain transistor QGX00, which on the other hand results in larger variation in the bit-line BL0 potential than in the complementary bit-line BLX0 potential. The potential variation (i.e., potential difference) produced in the bit line BL0 and BLX0 pair is multiplied by the sense amplifier SA0. As a result, the bit line BL0 is of a low potential, while the complementary bit line BLX0 is of a high potential, thereby determining the data as "0". The determination result is outputted from the data output lines DL0 and DLX0.

In reading out the data from the capacitors C00 and CX00 in which the respective capacitive film is made of a ferroelectric, stress which is applied to the capacitive film during the read operation can be lessened by adjusting: the second voltage value VRD2 which is established so that a voltage applied to the capacitive film does not exceed the coercive voltage and which is applied to the cell plate line CP0; the capacitance values of the capacitors; the capacitance values of the sub bit lines SBL00 and SBLX00; the respective junction capacitances of the pass transistors QP00 and QPX00, of the reset transistors QR00 and QRX00, and of the charge transistors QS00 and QSX00; the respective gate capacitances of the gain transistors QG00 and QGX00; and the interconnect capacitances, for example. The resultant reduced stress allows the semiconductor storage device of the first embodiment to perform data-readable operation more than $10^{15}$ times as opposed to $10^8$ through $10^{10}$ times in the conventional device.

The position of the switch SW is then changed to connect the reset line RST0, for example, to the data write circuit WR0, for example. Subsequently, a pulse voltage for rewriting, whose voltage value is VRSTr, is applied from the data write circuit WR0 to the reset line that is associated to one of the bit lines BL0 and BLX0 which has changed to a low potential during the data-readout. In this embodiment, the pulse voltage for rewriting is applied to the reset line that is related to the bit line BL0 that has changed to a low potential during the data-readout. At this time, the reset line RSTX0, which is complementary to the reset line RST0, is supplied with the ground potential from the data write circuit WRX0.

Simultaneously with the application of the voltage VRSTr for rewriting, the word line WL0 is set to a low potential to turn off the pass transistors QP00 and QPX00, while the potential of the pre-charge starting line PCE is set low, thereby activating the pre-charge transistors QQ0 and QQX0. The cell plate line CP0 is then set to a low potential, while the reset transistor control line RE0 is set to a high potential to turn on the reset transistors QR00 and QRX00. As a result of the series of controls, the potential of the sub bit line SBL00 is the voltage VRSTr for rewriting, while the complementary sub bit line SBLX00 is at the ground potential (at a timing t5 in FIG. 3.)

Thereafter, the word line WL0 is set to a high potential to turn on the pass transistors QP00 and QPX00 so that the pulse voltage VRSTr for rewriting is applied to the storage node SN00 of the capacitor C00 to compensate for the variation in polarization in the capacitor C00 created due to the application of the read voltage (VRD2). On the other hand, the storage node SNX00 of the capacitor CX00 and the cell plate line CP0 are at the ground potential so that the voltage across both electrodes in the capacitor CX00 is made zero (at a timing t6 in FIG. 3).

Then, the output value of the data write circuit WR0 is switched from the voltage VRSTr for rewriting to the ground potential to supply the storage node SN00 of the capacitor C00 with the ground potential. The applied ground potential makes the voltage across both electrodes in the capacitor C00 zero (at a timing t7 in FIG. 3.), after which the potential of the word line WL0 is set low, thereby completing the read operation.

In this embodiment, data is recorded in the two capacitors C00 and CX00 included in the memory cell MC00, for example, by polarizing their ferroelectric capacitive films in the opposite direction to each other, and the pulse voltage (VRSTr) for rewriting is applied during the read operation only to the capacitor in which the polarization direction is different from the direction of the read voltage that has been applied for the readout of the stored data. Specifically, in the first embodiment, the pulse for rewriting is applied from the data read circuit WR0 to the capacitor C00 in which downward polarization is recorded, while no pulse for rewriting is applied to the capacitor CX00 in which upward polarization is stored. This is because the pulse for reading, applied from the cell plate line CP0, decreases the absolute value of polarization in the capacitor C00, for example, in which downward polarization has been recorded, while the application of the read pulse does not reduce the absolute value of polarization in the capacitor CX00 in which upward polarization has been recorded.

It should be noted that the pulse voltage VRSTr for rewriting applied to the reset line RST0 may be smaller than the voltage VRSTw for writing shown in FIG. 2, and thus needs only to be at such a level that the state of polarization that has changed due to the read operation is permitted to revert to its state before the read operation, that is, at the coercive voltage level.

As described above, the first embodiment employs the structure in which one memory cell includes two capacitors where data is recorded as polarizations created in the different directions. Further, in the first embodiment, only the capacitor in which the amount of polarization changes due to the read operation is subjected to the application of the pulse voltage VRSTr for rewriting, which is smaller than the pulse voltage VRSTw for normal write operation which has a voltage value at which the amount of polarization in the capacitor is saturated. These features of the first embodiment permit stresses applied to the ferroelectric capacitive films to be reduced, while allowing the state of polarization that has varied due to the read operation to revert to its state before the read operation.

The first embodiment is characterized by the presence of, for example, the charge transistors QS00 and QSX00, which charge, by establishing an electrical path from the respective bit lines BL0 and BLX0, the sub bit lines SBL00 and SBLX00 and then the gain-transistor QG00 and QGX00 gates up to about the threshold voltage of the gain transistors QG00 and QGX00, and by the existence of, for example, the current shutoff transistors QC00 and QCX00, which shut off current between the bit line BL0 and the gain transistor QG00 drain and between the bit line BLX0 and the gain transistor QGX00 drain, respectively. However, it should be noted that the both types of transistor pairs do not necessarily have to be provided, but the provision of the transistor pairs of one of the two types produces the effects of the present invention.

(Second Embodiment)

Hereinafter, a second embodiment of the present invention will be described with reference to the accompanying drawings.

The circuit configuration of a semiconductor storage device and a data-writing method adopted in the second embodiment are the same as those employed in the first embodiment shown in FIGS. 1 and 2, but a data-reading method in this embodiment is different from that of the first embodiment.

In this embodiment, referring to a timing chart shown in FIG. 4, an operation for reading out data "0" that has been written into the memory cell MC00 in the same manner as in the first embodiment, for example, will be described.

In the data read operation, the switches SW are switched so as to connect to the reset lines RST0 and RSTX0 to the ground power source so that the reset line RST0, for example, is supplied with the ground potential. At this time, a low potential is provided to the pre-charge starting line PCE to turn on the pre-charge transistors QQ0 through QQX1, such that the bit lines BL0 and BLX0 are both pre-charged to a high potential.

Figure 4:
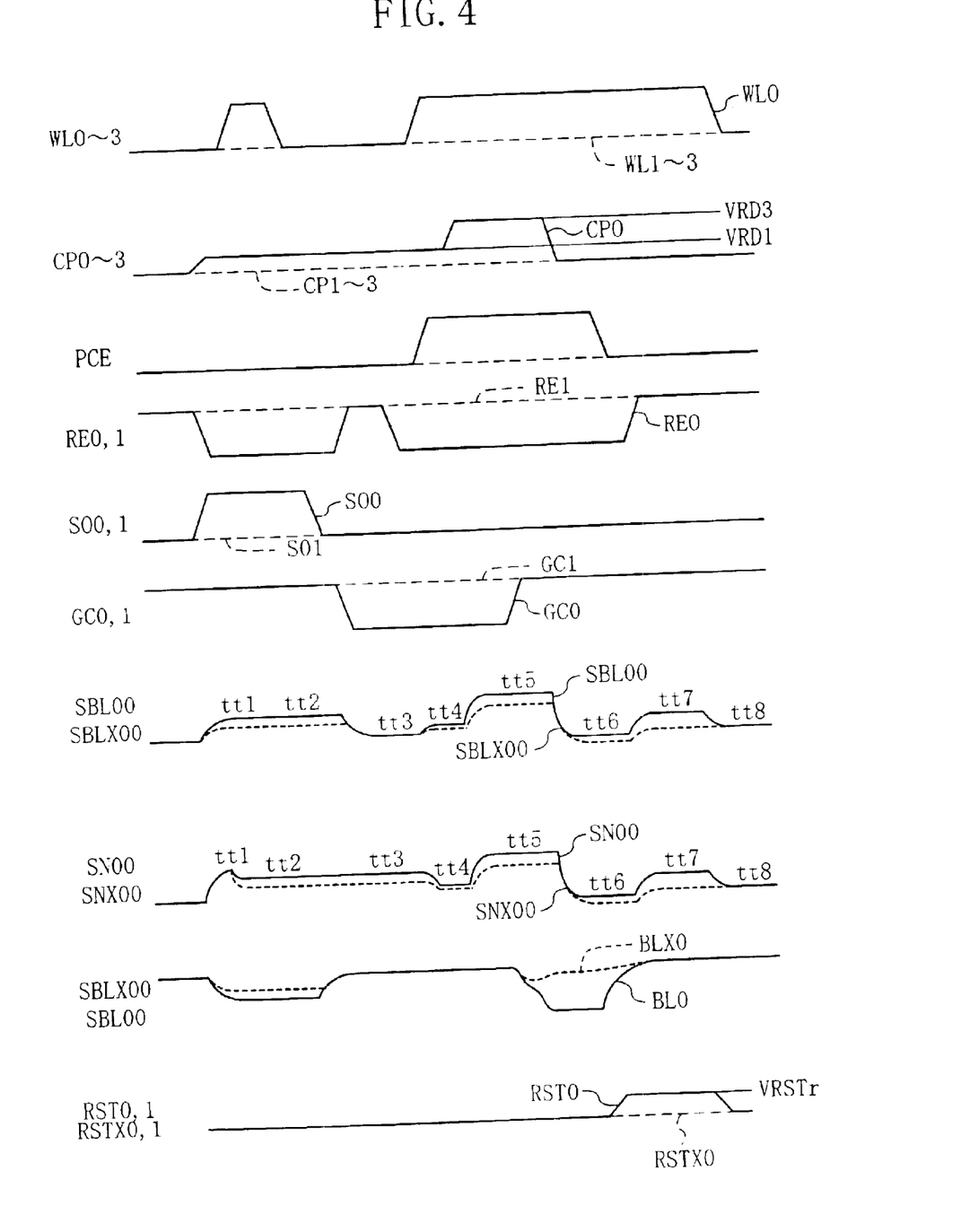
FIG. 4 is a timing chart indicating read operation in a semiconductor storage device in accordance with a second embodiment of the present invention.

At this point in time, as shown in FIG. 4, the potentials of the word lines WL0 through WL3, cell plate lines CP0 through CP03, and charge transistor control lines SO0 and SO1 are all set low.

The reset transistor control lines RE0 and RE1 and the current shutoff transistor control lines QC0 and QC1 are all set to a high potential, as a result of which the reset transistors QR00 and QRX01 are in the "on" state, thereby causing the sub bit lines SBL00 and SBLX00 to have the ground potential. The current shutoff transistors QC00 and QCX00 are also in the "on" state so that electrical connection is established between the drain of the gain transistor QG00 and the bit line BL0 and between the drain of the gain transistor QGX00 and the bit line BLX0.

The reset transistor control line RE0 is then set to a low potential to turn off the reset transistors QR00 and QRX00, while at the same time the charge transistor control line SO0 is set to a high potential to turn on the charge transistors QS00 and QSX00. This results in the formation of closed circuits in which the respective drains of the gain transistors QG00 and QGX00 are connected to their respective gates via the current shutoff transistors QC00 and QCX00 and the charge transistors QS00 and QSX00, respectively, with the respective pre-charge transistors QQ0 and QQX0 functioning as load. As a consequence, the respective potentials of the gain-transistor QG00 and QGX00 gates, that is, the respective potentials of the sub bit lines SBL00 and SBLX00 are at the threshold voltage levels VT00 and VTX00 (as seen at a timing tt1 in FIG. 4) of the gain transistors QG00 and QGX00. In this embodiment, the sizes of the pre-charge transistors QQ0 and QQX0 and gain transistors QG00 and QGX00 may be adjusted so that the values VT00 and VTX00 become voltage values obtained by adding a respective amount of offset to the threshold voltage of the gain transistors QG00 and QGX00.

At substantially the same time that the potential of the reset transistor control line RE0 is set low, the potential of the cell plate line CP0 is increased to the first voltage value VRD1 so that the potentials of the storage nodes SN00 and SNX00 of the capacitors C00 and CX00 are set to the first voltage value VRD1. The first voltage value VRD1 is preferably equal to the uppermost value in the range of variation in the gain-transistor QG00 and QGX00 threshold voltage caused during the manufacturing process. Alternatively, it is preferable that the first voltage value VRD1 be set slightly higher than the uppermost value, and that the difference between the first voltage value VRD1 and the threshold voltage be smaller than the coercive voltage of the capacitive film made of a ferroelectric. More specifically, the first voltage value VRD1 is set at a value which is higher than the uppermost value of the threshold voltages by 0.1 V, for example. In the case where the first voltage value VRD1 is set in this manner, when the pass transistors QP00 and QPX00 are turned on at the next stage (that is, at a timing tt2 shown in FIG. 4), a voltage which has the same polarity as that of a voltage which will be applied in the read operation and which is smaller than or equal to the coercive voltage of the capacitive film is applied to the respective capacitors C00 and CX00. Accordingly, it is possible to avoid a situation in which a voltage higher than the coercive voltage is applied to the capacitive films before the data is read out to cause the polarity to be reversed, thereby destructing the stored data.

Subsequently, a high voltage is applied to the word line WL0 to turn on the pass transistors QP00 and QPX00 so that the potentials of the storage nodes SN00 and SNX00 of the capacitors C00 and CX00 are raised to the threshold voltages VT00 and VTX00, respectively (at the timing tt2).

Thereafter, the word line WL0 is set to a low potential to turn off the pass transistors QP00 and QPX00. Following this, the charge transistor control line SO0 is set to a low potential to turn off the charge transistors QS00 and QSX00, and the reset transistor control line RE0 is set to a high potential. Then, given that the respective capacitance values of the capacitors C00 and CX00 are Cf00 and Cfx00, the storage nodes SN00 and SNX00 store respective electric charges which are expressed by the following equations 3 and 4. It should be noted that in the case of capacitors including a ferroelectric in their capacitive film, their capacitance value varies, as is well known in the art, depending on the state of polarization stored therein. The sub bit lines SBL00 and SBLX00 are reset to the ground potential (at a timing tt3 shown in FIG. 4) because the potential of the reset transistor control line RE0 has changed to the high potential.

$q00 = Cf00 \cdot (VRD1 - VT00)$      Equation 3

$qx00 = Cfx00 \cdot (VRD1 - VTX00)$      Equation 4

Simultaneously with changing the potential of the reset transistor control line RE0 to the high potential, the current shutoff transistor control line GC0 is set to a low potential to put the current shutoff transistors QC00 and QCX00 into the shutoff state (i.e., the "off" state) so that the bit lines BL0 and BLX0 are pre-charged to a high potential, after which the reset transistor control line RE0 is changed to a low potential. Subsequently, the pre-charge staring line PCE is set to a high potential and deactivated so that the pre-charge transistors QQ0 and QQX0 are turned off. At the same time, the sense amplifier SA0 is activated, while a high voltage is applied to the word line WL0 to turn on the pass transistors QP00 and QPX00, followed by application, to the cell plate line CP0, of a positive polarity pulse voltage of a third voltage value VRD3 for reading. As a result, the electric charge moves from the capacitors C00 and CX00 to the respective gates of the gain transistors QG00 and QGX00, such that the potentials of the sub bit lines SBL00 and SBLX00 increase (at timings tt4 and tt5 shown in FIG. 4)

After the variations caused in the potentials of the sub bit lines SBL00 and SBLX00 have stabilized, a high voltage is again applied to the current shutoff transistor control line GC0 to make conductive (i.e., turn on) the current shutoff transistors QC00 and QCX00. This causes the electric charge to flow out of the bit lines BL0 and BLX0 to the reset lines RST0 and RSTX0 via the on-state current shutoff transistors QC00 and QCX00 and the on-state gain transistors QG00 and QGX00, respectively. As a result, the potentials of the bit lines BL0 and BLX0 decrease from the pre-charge level.

The application of the positive polarity pulse voltage (i.e., the third voltage value VRD3) to the cell plate line CP0 produces, in the pair of sub bit lines SBL00 and SBLX00, respective potentials VSBL00 and VSBLX00 which are expressed by the following equations 5 and 6 where CSBL represents the sub-bit-line SBL00 and SBLX00 capacitance value (that is, the respective junction capacitances of the pass transistors QP00 and QPX00, of the reset transistors QR00 and QRX00, and of the charge transistors QS00 and QSX00, the respective gate capacitances of the gain transistors QG00 and QGX00, and the interconnect capacitances.)

$$VSBL00 = Cf00 \cdot (VRD3 - VRD1 - VT00)/(CSBL + Cf00) \quad \text{Equation 5}$$

$$VSBLX00 = Cfx00 \cdot (VRD3 - VRD1 - VTX00)/(CSBL + Cfx00) \quad \text{Equation 6}$$

Accordingly, the ratio between the drain-source currents IDS00 and IDSX00 of the two gain transistors QG00 and QGX00 are expressed by the following equation 7.

$$IDS00/IDSX00 = (VSBL00 - VT00)^2/(VSBLX00 - VTX00)^2 \quad \text{Equation 7}$$

The expressions in the parentheses in the numerator and the denominator are expressed by the following equations 8 and 9, respectively.

$$VSBL00 - VT00 = Cf00 \cdot (VRD3 - VRD1)/(CSBL + Cf00) - CSBL \cdot VT00/(CSBL + Cf00) \quad \text{Equation 8}$$

$$VSBLX00 - VTX00 = Cfx00 \cdot (VRD3 - VRD1)/(CSBL + Cfx00) - CSBL \cdot VTX00/(CSBL + Cfx00) \quad \text{Equation 9}$$

It should be noted that the threshold voltage is multiplied by the coefficient of CSBL/(CSBL+Cf00) or CSBL/(CSBL+Cfx00). This means that variation in the threshold voltage is permitted to be reduced by the ratio CSBL/(CSBL+Cf00) or CSBL/(CSBL+CFx00).

In the second embodiment, after the sub bit lines SBL00 and SBLX00 and the respective storage nodes SN00 and SNX00 of the capacitors C00 and CX00 have been pre-charged up to the threshold voltage of the gain transistors QG00 and QGX00, only the sub bit line SBL00 is reset to the ground potential and the data is read out; therefore the ratio between the drain-source currents is allowed to be at the same level as the conventional ratio.

Thus, since the value of IDS00/IDSX00 is larger than 1, the channel resistance of the gain transistor QG00 gets smaller than that of the gain transistor QGX00. As a result, the potential of the bit line BL0 varies more largely than the potential of the complementary bit line BLX0. The resultant potential difference between the bit line BL0 and BLX0 pair is multiplied by the sense amplifier SA0, which consequently causes the bit line BL0 and the complementary bit line BLX0 to have low and high potentials, respectively, thereby leading to the determination that the data is "0". The determination result is outputted from the data output lines DL0 and DLX0.

In reading out the data from the capacitors C00 and CX00 in which the capacitive film is made of a ferroelectric as in this embodiment, stress which is applied to the capacitive film during the read operation can be lessened by adjusting: the read voltage (i.e., the third voltage value VRD3) which is established so that a voltage applied to the capacitive film does not exceed the coercive voltage and which is applied to the cell plate line CP0; the capacitance values of the capacitors; and the capacitance values of the sub bit lines SBL00 and SBLX00. The resultant reduced stress allows the semiconductor storage device of the second embodiment to perform data-readable operation more than $10^{15}$ times as opposed to $10^8$ through $10^{10}$ times in the conventional devices.

The position of the switch SW is then changed to connect the reset line RST0, for example, to the data write circuit WR0, for example. Subsequently, a pulse voltage for rewriting, whose voltage value is VRSTr, is applied from the data write circuit WR0 to the reset line that is associated to one of the bit lines BL0 and BLX0 which has changed to a low potential during the data-readout. In this embodiment, the pulse voltage for rewriting is applied to the reset line that is related to the bit line BL0 that has changed to a low potential during the data-readout. At this time, the reset line RSTX0, which is complementary to the reset line RST0, is supplied with the ground potential from the data write circuit WRX0.

Next, the pre-charge starting line PCE is set to a low potential to activate the pre-charge transistors QQ0 and QQX0, while at the same time the reset transistor control line RE0 is set to a high potential to turn on the reset transistors QR00 and QRX00, so that the pulse voltage, i.e., the voltage VRSTr for rewriting is applied to the storage node SN00 of the capacitor C00 to compensate for downward polarization in the capacitor C00. On the other hand, the ground potential is supplied to the storage node SNX00 of the capacitor CX00 and the cell plate line CP0, thereby making the voltage across both electrodes of the capacitor CX00 zero (at a timing tt7 shown in FIG. 4).

Thereafter, a low potential is outputted from the data write circuit WR0 to set the storage node SN00 of the capacitor C00 also to the ground potential so that the voltage across both electrodes of the capacitor C00 is made zero. Subsequently, the potential of the word line WL0 is set to a low potential, thereby completing the read operation (at a timing tt8 shown in FIG. 4).

It should be noted that the pulse voltage VRSTr for rewriting applied to the reset line RST0 may be smaller than the voltage VRSTw for writing shown in FIG. 2, and thus needs only to be at such a level that the state of polarization that has changed due to the read operation is permitted to revert to its state before the read operation, that is, at the coercive voltage level.

Further, the foregoing embodiments of the present invention describe the cases in which memory cells each including two capacitors, that is, so-called 2T2C memory cells are used. However, the structures of the present invention are effective even in cases in which memory cells each including one capacitor, that is, so-called 1T1C memory cells are used as long as such cases employ a structure in which reference cells for producing reference voltage and the memory cells are both connected to gain transistors for detection of difference in channel resistance between the gain transistors.

What is claimed is:

1. A semiconductor storage device comprising:
   a memory cell including a capacitor and a pass transistor, wherein the capacitor includes a capacitive film made of a ferroelectric and the pass transistor is connected to a storage node of the capacitor;
   a sub bit line connected to the pass transistor;
   a gain transistor whose gate, drain and source are connected to the sub bit line, a bit line, and a source line, respectively; and
   a charging device for charging the voltage of the sub bit line up to the threshold voltage of the gain transistor or a voltage value obtained by adding an offset to the threshold voltage.

2. The device of claim 1, further comprises a reset-voltage applying device for applying a predetermined reset voltage to the sub bit line.

3. A method for driving a semiconductor storage device, wherein the semiconductor storage device includes: a memory cell which includes a capacitor having a capacitive film made of a ferroelectric, and a pass transistor connected to one electrode of the capacitor; a sub bit line connected to the pass transistor; a gain transistor whose gate, drain and source are connected to the sub bit line, a bit line and a source line, respectively; and a charging device for charging the voltage of the sub bit line up to the threshold voltage of the gain transistor or a voltage value obtained by adding an offset to the threshold voltage, the method comprising the steps of:
   (a) charging, by the charging device, the sub bit line and said one electrode of the capacitor up to the threshold voltage or the voltage value obtained by adding the offset to the threshold voltage, and
   (b) applying a read voltage to the other electrode of the capacitor for detection of variation in channel resistance in the gain transistor, thereby reading out data retained in the capacitor.

4. The method of claim 3, wherein the semiconductor storage device includes a reset-voltage applying device for applying a predetermined reset voltage to the sub bit line, and the step (a) further includes the step of turning on the reset-voltage applying device so that the reset voltage is applied to the sub bit line, and thereafter turning off the reset-voltage applying device.

5. The method of claim 3, wherein the step (a) further includes the step of applying, to the other electrode of the capacitor, a voltage which is an intermediate voltage between the read voltage and the threshold voltage or between the read voltage and the voltage value that is obtained by adding the offset to the threshold voltage, and
   the voltage applied across both the electrodes of the capacitor does not exceed the coercive voltage of the capacitive film.

6. The method of claim 3, wherein the memory cell includes a pair of capacitors each including a capacitive film made of a ferroelectric, and
   the method further includes, after the step (b), the step (c) of applying, to one of the capacitors in which the amount of polarization is varied by the read operation, a voltage for rewriting which is smaller than normal write voltage which causes said amount of polarization to be saturated.

7. A semiconductor storage device comprising:
   a memory cell including a capacitor and a pass transistor, wherein the capacitor includes a capacitive film made of a ferroelectric and the pass transistor is connected to a storage node of the capacitor;
   a sub bit line connected to the pass transistor;
   a gain transistor whose gate, drain and source are connected to the sub bit line, a bit line, and a source line, respectively; and
   a current shutoff device for shutting off drain-source current in the gain transistor.

8. A method for driving a semiconductor storage device, wherein the semiconductor storage device includes: a memory cell which includes a capacitor having a capacitive film made of a ferroelectric, and a pass transistor connected to one electrode of the capacitor; a sub bit line connected to the pass transistor; a gain transistor whose gate, drain and source are connected to the sub bit line, a bit line and a source line, respectively; and a current shutoff device for shutting off drain-source current in the gain transistor, the method comprising the step of:
   (a) applying a read voltage to the other electrode of the capacitor, and shutting off the drain-source current by the current shutoff device while the potential of the sub bit line varies.

9. The method of claim 8, wherein the memory cell includes a pair of capacitors each including a capacitive film made of a ferroelectric, and
   the method further includes, after the step (a), the step (b) of applying, to one of the capacitors in which the amount of polarization is varied by the read operation, a voltage for rewriting which is smaller than normal write voltage which causes said amount of polarization to be saturated.

* * * * *